United States Patent
Schrödinger

(10) Patent No.: US 6,590,457 B2
(45) Date of Patent: Jul. 8, 2003

(54) PHASE DETECTOR AND CLOCK REGENERATION DEVICE

(75) Inventor: Karl Schrödinger, Berlin (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/957,391

(22) Filed: Sep. 20, 2001

(65) Prior Publication Data

US 2002/0070813 A1 Jun. 13, 2002

Related U.S. Application Data

(63) Continuation of application No. PCT/DE00/03522, filed on Sep. 29, 2000.

(30) Foreign Application Priority Data

Sep. 30, 1999 (DE) .......................... 199 48 690

(51) Int. Cl.[7] ................................ H03L 7/00
(52) U.S. Cl. .................. 331/1 A; 331/17; 331/11; 331/25; 375/375; 375/376; 327/156
(58) Field of Search ................. 331/25, 1 A, 17, 331/11; 375/376, 375; 327/156

(56) References Cited

U.S. PATENT DOCUMENTS

| | | |
|---|---|---|
| 4,422,176 A | 12/1983 | Summers ................... 375/376 |
| 5,027,085 A | 6/1991 | DeVito ......................... 331/1 |
| 5,770,976 A | 6/1998 | Nagaraj ........................ 331/1 |
| 6,034,554 A * | 3/2000 | Francis et al. ................. 327/7 |

FOREIGN PATENT DOCUMENTS

| | | |
|---|---|---|
| DE | 44 43 417 C1 | 2/1996 |
| DE | 197 17 586 C1 | 8/1998 |
| JP | 1112335 A | 4/1999 |

\* cited by examiner

*Primary Examiner*—Arnold Kinkead
(74) *Attorney, Agent, or Firm*—Laurence A. Greenberg; Werner H. Stemer; Gregory L. Mayback

(57) ABSTRACT

A phase detector device and a clock regeneration device for phase centering when incoming data are sampled at a clock rate, which is in particular substantially half the size of the high clock rate of the incoming data, are provided. The device includes a plurality of flip-flops. The phase detector and the clock regeneration device further include correction devices for producing a correction signal. The correction signal can be passed to an integrator in which a control signal for an oscillator can be produced from the correction signal and the output signals of the first, second and third weighting devices. The clock rates of the first and the second clock signals correspond to substantially half the high clock rate. The phase of the first clock signals is shifted by 180° with respect to the phase of the second clock signals.

8 Claims, 4 Drawing Sheets

PHASE DETECTOR AND CLOCK REGENERATION DEVICE

CROSS-REFERENCE TO RELATED APPLICATION

This application is a continuation of copending International Application PCT/DE00/03522, filed Sep. 29, 2000, which designated the United States.

BACKGROUND OF THE INVENTION

Field of the Invention

The present invention lies in the field of phase detectors for phase centering. More particularly, the present invention relates to phase detectors for phase centering in a clock regeneration device. The invention also relates to such a clock regeneration device.

Such devices are used to detect the phase difference between a data signal and a clock signal and to produce a control signal, which is representative of the ascertained phase difference. The control signal is then passed to the oscillator device, which produces the clock signal in order to initiate correction in the oscillator device, so that the ascertained phase difference can be corrected.

In U.S. Pat. No. 5,027,085, a phase detector operating in the aforementioned manner is described. In the phase detector, the incoming data are sampled at a clock rate, which corresponds to the clock rate of the incoming data. However, the conventional phase detector is not suitable for use in a clock regeneration device, in which the incoming data are sampled at a clock rate, which corresponds to substantially half the clock rate of the incoming data. Sampling at substantially half the clock rate is customary for transmitting data at a high clock rate at the speed limit of the electrical circuits.

SUMMARY OF THE INVENTION

It is accordingly an object of the present invention to provide a phase detector device and a clock regeneration device that overcomes the hereinafore-mentioned disadvantages of the heretofore-known devices of this general type and that allows phase centering, when incoming data are sampled at a clock rate which is lower than, in particular substantially half the size of, the clock rate of the incoming data.

With the foregoing and other objects in view, there is provided, in accordance with the invention, a phase detector including a data line transmitting a data at least at a high clock rate, a first clock line for transmitting first clock signals and a second clock line for transmitting second clock signals, a first weighting device, a second weighting device and a third weighting device, a first flip-flop having a first input connected to the data line, a second input connected to the first clock line and an output. A second flip-flop having a first input connected to the output of the first flip-flop, a second input connected to the second clock line and an output, a third flip-flop having a first input connected to the output of the second flip-flop are also provided.

A second input connected to the first clock line and an output, a first XOR gate having a first input connected to the data line, a second input connected to the output of the first flip-flop and an output connected to the first weighting device, a second XOR gate having a first input connected to the output of the first flip-flop and to the first input of the second flip-flop, a second input connected to the output of the second flip-flop and to the first input of the third flip-flop and an output connected to the second weighting device are also provided.

A third XOR gate having a first input connected to the output of the second flip-flop and to the first input of the third flip-flop, a second input connected to the output of the third flip-flop and an output connected to the third weighting device, a fourth flip-flop having a first input connected to the data line, a second input connected to the second clock line and an output, a fifth flip-flop having a first input connected to the output of the fourth flip-flop, a second input connected to the first clock line and an output, a sixth flip-flop having a first input connected to the output of the fifth flip-flop and a second input connected to the second clock line, and correction devices for producing a correction signal are also provided. The first and second clock signals have clock rates corresponding to substantially half the high clock rate, and the first clock signals have a phase shifted by 180° with respect to a phase of the second clock signals.

In accordance with another feature of the invention, the correction devices include a further XOR gate having a first input connected to the output of the first flip-flop and a second input connected to the output of the fourth flip-flop, a first AND gate having a first input connected to an output of the further XOR gate, a second input connected to the first clock line and a further input connected to the output of the second flip-flop.

A second AND gate having a first input connected to the output of the further XOR gate and a second input connected to the first clock line, and a fourth, a fifth and a sixth weighting device, the fourth weighting device having a first input of connected to the first clock line, the fifth weighting device having a first input connected to an output of the first AND gate, and the sixth weighting device having a first input connected to an output of the second AND gate are also provided. The correction signal is produced from the output signals of the fourth, fifth and sixth weighting devices. This provides a combination of logic chips, which permits integration of the phase detector in integrated circuits using customary technology.

In accordance with another feature of the invention, there is provided a clock regeneration device including a data line transmitting data at least at a high clock rate, a first clock line for transmitting first clock signals and a second clock line for transmitting second clock signals, a phase detector, an oscillator, and an integrator connected to the phase detector and connected to the oscillator. The oscillator produces the first and second clock signals.

The first and second clock signals have clock rates corresponding to substantially half the high clock rate, and the first clock signals have a phase shifted by 180° with respect to a phase of the second clock signals.

In accordance with another feature of the invention, the phase detector feeds the correction signal to the integrator.

In accordance with another feature of the invention, a control signal for the oscillator is produced from the correction signal and from the respective output signals from the first, second and third weighting devices.

In accordance with another feature of the invention, there is provided a clock regeneration device including a frequency detector for frequency centering. The frequency detector is connected to the first and second clock lines and the integrator such that the frequency detector can transmit a frequency detector signal to the integrator. The integrator includes switching devices for producing a control signal from the frequency detector signal, the correction signal and the output signals of the first, second and third weighting devices. In this manner, it is possible to perform frequency centering in addition to phase centering. This is particularly advantageous with the high tolerances of customary semiconductor technologies.

The fundamental advantage, which the present invention achieves over the prior art is that an opportunity is provided for using phase centering at substantially half the clock rate. Accordingly, the phase centering can also be used for data, which are transmitted at high clock rates at the speed limit of electrical circuits.

Other features which are considered as characteristic for the present invention are set forth in the appended claims.

Although the present invention is illustrated and described herein as embodied in a phase detector and a clock regeneration device, it is nevertheless not intended to be limited to the details shown, since various modifications and structural changes may be made therein without departing from the spirit of the present invention and within the scope and range of equivalents of the claims.

The construction and method of operation of the present invention, however, together with additional objects and advantages thereof will be best understood from the following description of specific embodiments when read in connection with the accompanying drawings.

DESCRIPTION OF THE PREFERRED EMBODIMENTS

In all the figures of the drawings, sub-features and integral parts that correspond to one another bear the same reference symbol in each case.

Figure 1:
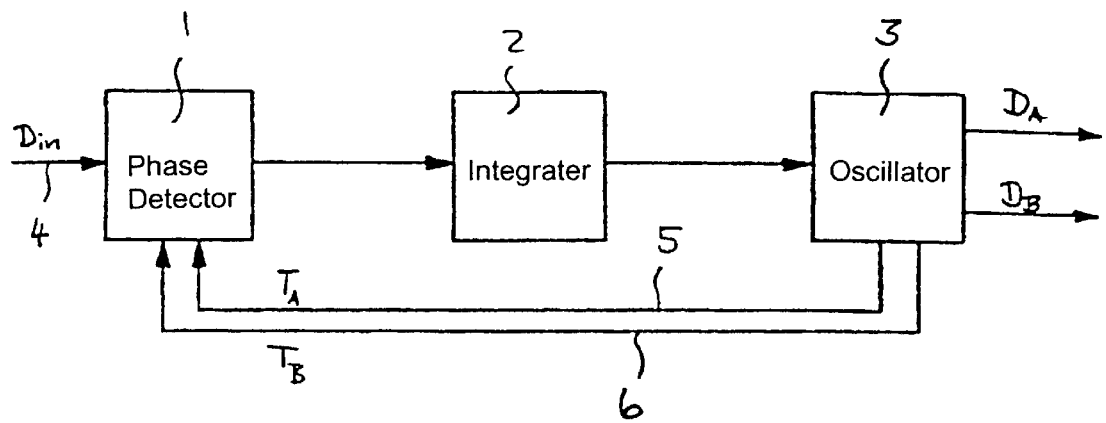
FIG. 1 is a schematic illustration of a clock regeneration device.

Referring now to the figures of the drawing in detail and first, particularly, to FIG. 1 thereof, there is seen one embodiment of a clock regeneration device including a phase detector 1, an integrator device 2 and an oscillator device 3. The phase detector 1 receives data $D_{in}$ via a data line 4. The data $D_{in}$ are transmitted at a high clock rate. For sampling the data $D_{in}$, the phase detector 1 receives first clock signals $T_A$ via a first clock line 5 and second clock signals $T_B$ via a second clock line 6. The clock rate of the first clock signals $T_A$ and the second clock signals $T_B$ respectively corresponds to substantially half of the high clock rate at which the data $D_{in}$ are transmitted; the phase of the first clock signals $T_A$ is shifted by 180° with respect to the phase of the second clock signals $T_B$.

Figure 3:
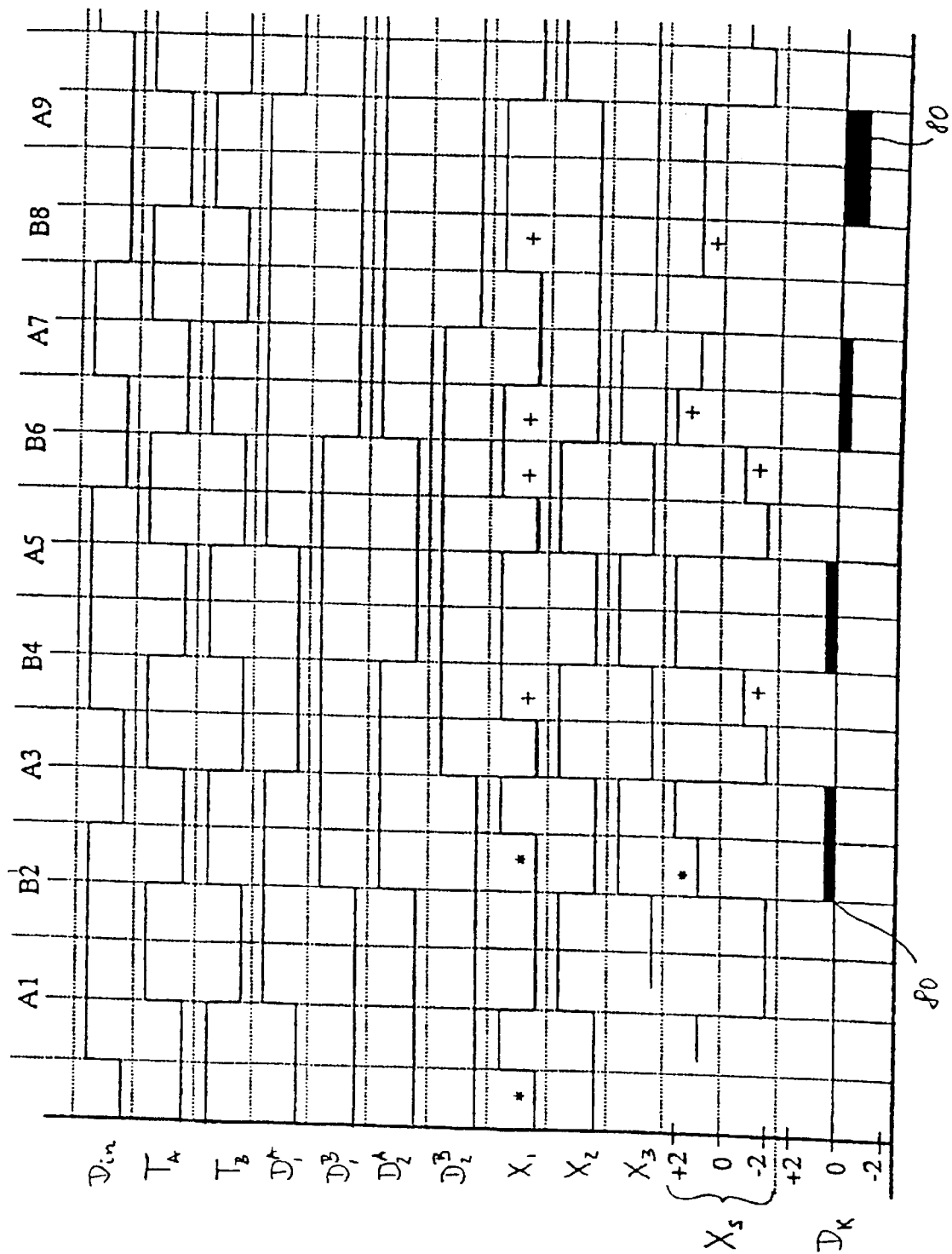
FIG. 3 is a schematic illustration of data signals without correction.
Figure 4:
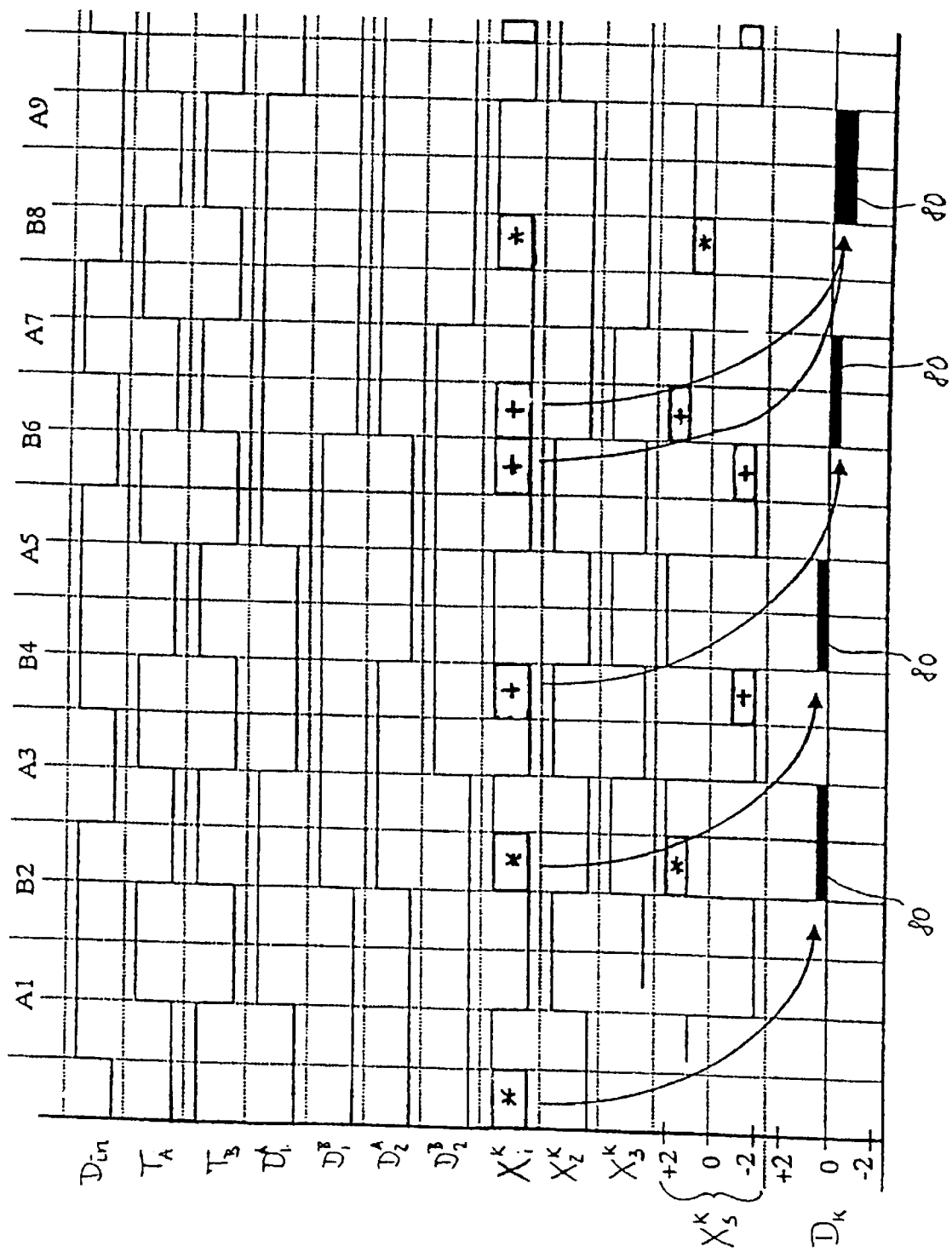
FIG. 4 is a schematic illustration of data signals with correction.

FIGS. 3–4 show signal waveforms for $T_A$, $T_B$ and $D_{in}$ respectively in the top region. The first and second clock signals $T_A$, $T_B$ can be used to sample the data $D_{in}$ in the phase detector 1 at a clock rate which is substantially half the size of the high clock rate of the data $D_{in}$. After the clock regeneration has been achieved using the phase detector 1, the integrator device 2, and the oscillator device 3, the data sampled using the first clock signals $T_A$ and the second clock signals $T_B$ are output by the oscillator 3 as outgoing data $D_A$ and $D_B$ (FIG. 1).

Figure 2:
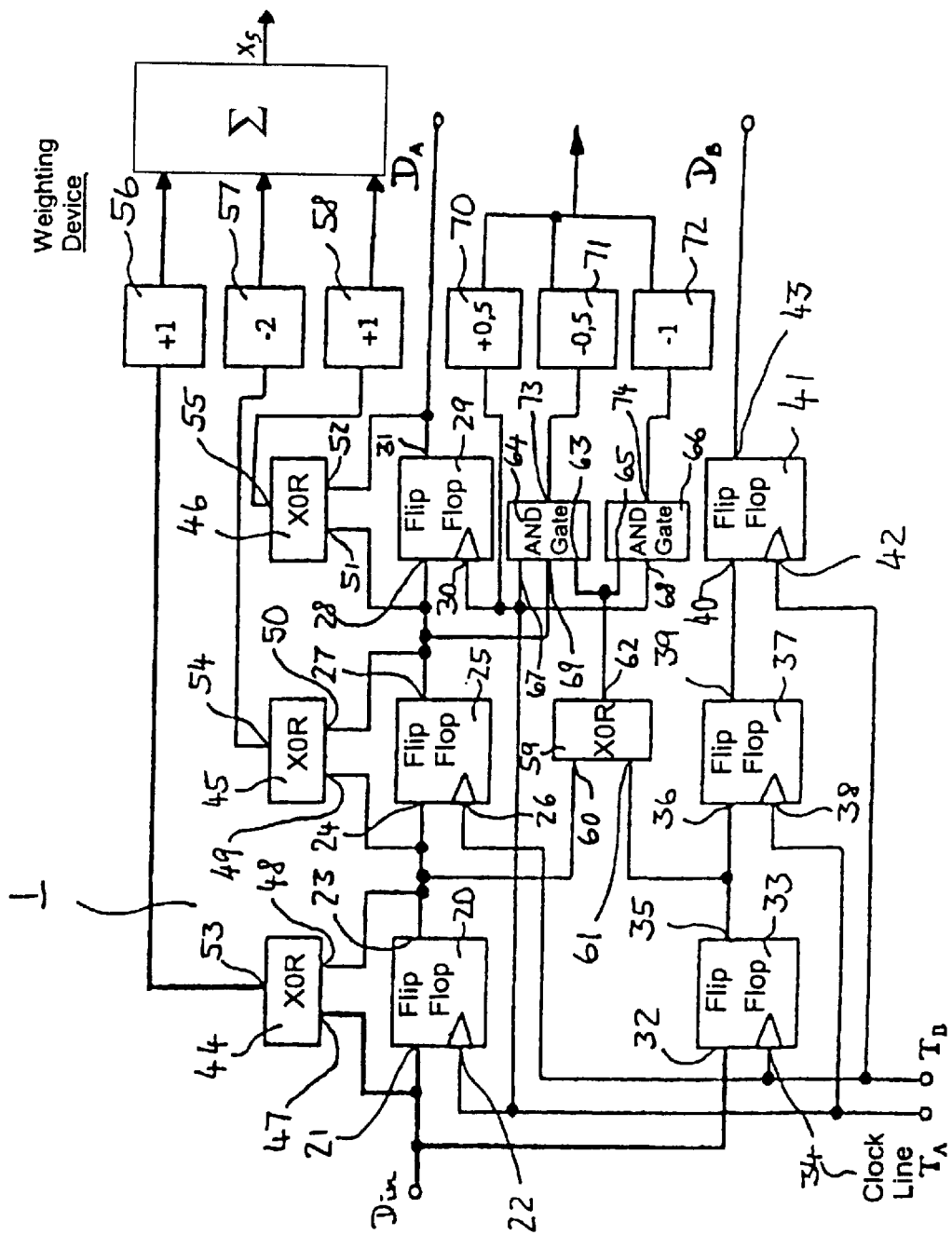
FIG. 2 is a circuit diagram, which illustrates a phase detector that can be used in the clock regeneration apparatus of FIG. 1.

FIG. 2 shows a phase detector 1. A first flip-flop 20 receives the data $D_{in}$ via a first input 21. The first clock signals $T_A$ are fed to a second input 22 of the first flip-flop 20. An output 23 of the first flip-flop 20 is connected to a first input 24 of a second flip-flop 25. The second flip-flop 25 receives the second clock signals $T_B$ at a second input 26. An output 27 of the second flip-flop 25 is connected to a first input 28 of a third flip-flop 29. The third flip-flop 29 receives the first clock signals $T_A$ at a second input 30. An output 31 of the third flip-flop 29 produces the output data $D_A$.

The data $D_{in}$ are passed to a first input 32 of a fourth flip-flop 33 to sample the data $D_{in}$ in the phase detector 1, at substantially half the high clock rate. Further, the fourth flip-flop 33 receives the second clock signals $T_B$ via a second input 34. An output 35 of the fourth flip-flop 33 is connected to a first input 36 of a fifth flip-flop 37. The fourth flip-flop 37 receives the first clock signals $T_A$ via a second input 38. An output 39 of the fifth flip-flop 37 is connected to a first input 40 of a sixth flip-flop 41. The sixth flip-flop 41 receives the second clock signals $T_B$ via a second input 42. An output 43 of the sixth flip-flop 41 produces the output data $D_B$.

To perform phase centering, the phase detector 1 includes a first, a second and a third XOR gate 44, 45, 46, respectively. A first input 47 of the first XOR gate 44 is connected to a first input 21 of the first flip-flop 20. A second input 48 of the first XOR gate 44 is connected to the output 23 of the first flip-flop 20. A first input 49 of the second XOR gate 45 is connected to the output 23 of the first flip-flop 20 and to the first input 24 of the second flip-flop 25. A second input 50 of the second XOR gate 45 is connected to the output 27 of the second flip-flop 25 and to the first input 28 of the third flip-flop 29. A first input 51 of the third XOR gate 46 is connected to the output 27 of the second flip-flop 25 and to the first input 28 of the third flip-flop 29. A second output 52 of the third XOR gate 46 is connected to the output 31 of the third flip-flop 29.

Outputs 53, 54, 55 of the first, second and third XOR gates 44, 45, 46 are connected to the weighting devices 56, 57, 58 respectively. In the weighting devices 56, 57, 58, the signals produced at the outputs 53, 54, 55 of the XOR gates 44, 45, 46 are multiplied by factors +1, −2 and +1 respectively.

Referring now to FIG. 3 again, there are seen some of the signals produced at the respective outputs of the flip-flops 20, 25, 29, 33, 37, 41, of the XOR gates 44, 45, 46, and of the weighting devices 56, 57, 58. Ai and Bj (i=1, 3, 5, . . . ; j=2, 4, 6, . . . ) respectively denote bits of the data $D_{in}$, which have been sampled using the first and second clock signals $T_A$, $T_B$. $D^A_1$ denotes the signal produced at the output 23 of the first flip-flop 20. $D^A_2$ denotes the signal produced at the output 27 of the second flip-flop 25. $D^B_1$ denotes the signal produced at the output 35 of the fourth flip-flop 33. $D^B_2$ denotes the signal produced at the output 39 of the fifth flip-flop 37.

Further, $X_i$ (i=1,2,3) denotes the respective output signal from the first, second and third XOR gates 44, 45, 46. The sum signal $X_s$ corresponds to the sum of the output signals $X_i$ from the XOR gates 44, 45, 46, respectively weighted using the weighting devices 56, 57, 58.

Due to sampling of the data $D_{in}$ at substantially half the high clock rate, missing pulse components (*) and surplus (+) pulse components arise in the signals $X_i$ and $X_s$. The phase detector 1 includes a correction device to correct the missing and surplus pulse components such that phase centering is made possible using the phase detector 1 (FIG. 2).

As shown in FIG. 2, the correction devices include a further XOR gate 59. A first input 60 of the further XOR gate 59 is connected to the output 23 of the first flip-flop and to the input 24 of the second flip-flop. A second input 61 of the further XOR gate 59 is connected to the output 35 of the fourth flip-flop 33 and to the input 36 of the fifth flip-flop 37. An output 62 of the further XOR gate 59 is connected to a first input 63 of a first AND gate 64 and to a first input 65 of a second AND gate 66. The first AND gate 64 receives the first clock signals $T_A$ via a second input 67. The second AND gate 66 receives the first clock signals $T_A$ via a second input 68. A third input 69 of the first AND gate 64 is connected to the output 27 of the second flip-flop 25 and to the first input 28 of the third flip-flop 29.

The correction devices also include a fourth, a fifth and a sixth weighting device 70, 71, 72. The fourth weighting device 70 is connected to the input 30 of the third flip-flop 29. The fifth and sixth weighting devices 71, 72 are connected to the respective outputs 73, 74 of the first and second AND gates 64, 66. Summation of the output signals from the fourth, fifth and sixth weighting devices 70, 71, 72 produces a correction signal $D_K$, which is shown in the bottom region of FIG. 3. The filled areas 80 represent the required correction signal $D_K$.

The correction signal $D_K$ is combined with the sum signal $X_S$ in the integrator device 2 in order to produce a control signal for the oscillator device 3, so that phase centering is achieved.

FIG. 4 shows corrected, weighted output signals $X^K_1$, $X^K_2$, $X^K_3$ from the first, second and third weighting devices 56, 57, 58, in addition to the signals ($D_{in}$, $T_A$, $T_B$, $D^A_1$, $D^A_2$, $D^B_1$, $D^B_2$) already shown in FIG. 3. A corrected sum signal $X^K_S$ is also shown.

One further embodiment includes the clock regeneration device shown in FIG. 1, which is complemented by a frequency detector 7.

Figure 5:
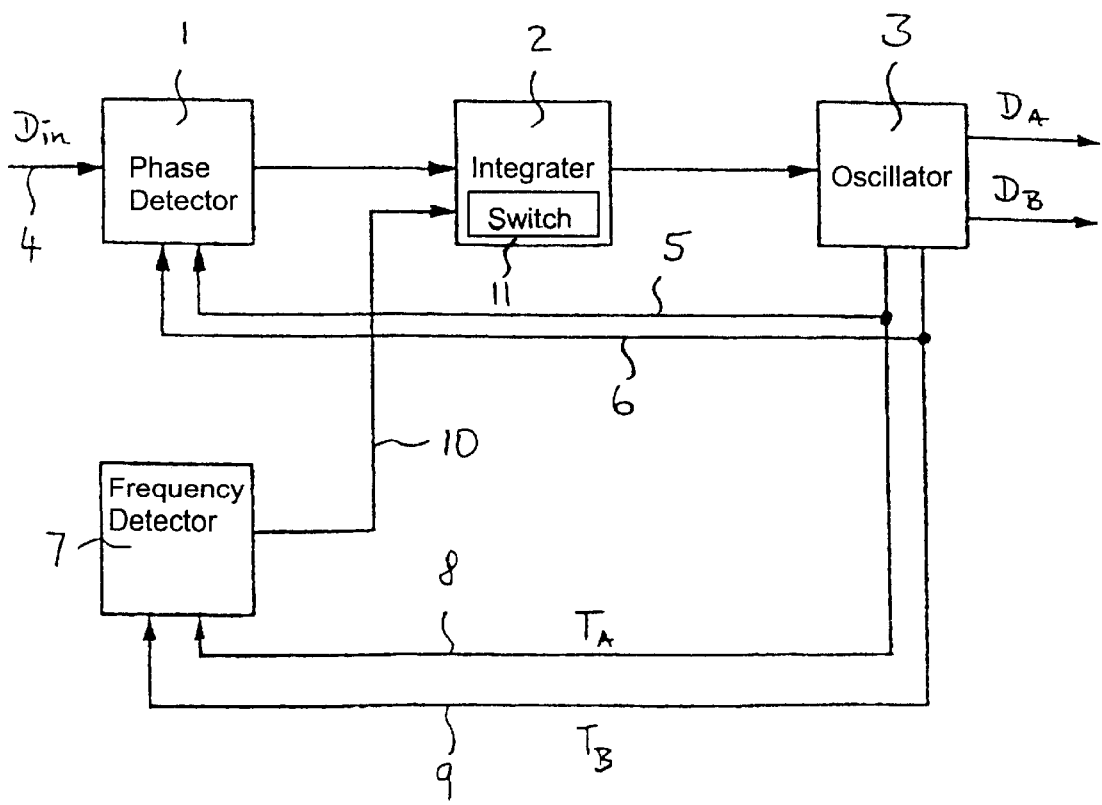
FIG. 5 is a schematic illustration of a clock regeneration device with a frequency detector.

FIG. 5 shows a frequency detector 7 connected to the oscillator device 3 through lines 8, 9. The frequency detector 7 is used to produce a frequency detector signal, which is passed to the integrator device 2 via the line 10. The integrator device 2 includes suitable switching devices 11 for combining the signals received from the phase detector 1 and from the frequency detector 7, in order to perform both phase centering and frequency centering.

I claim:

1. A phase detector, comprising:
   a data line transmitting data at least at a high clock rate;
   a first clock line for transmitting first clock signals and a second clock line for transmitting second clock signals;
   a first weighting device, a second weighting device and a third weighting device;
   a first flip-flop having a first input connected to said data line, a second input connected to said first clock line and an output;
   a second flip-flop having a first input connected to said output of said first flip-flop, a second input connected to said second clock line and an output;
   a third flip-flop having a first input connected to said output of said second flip-flop, a second input connected to said first clock line and an output;
   a first XOR gate having a first input connected to said data line, a second input connected to said output of said first flip-flop and an output connected to said first weighting device;
   a second XOR gate having a first input connected to said output of said first flip-flop and to said first input of said second flip-flop, a second input connected to said output of said second flip-flop and to said first input of said third flip-flop and an output connected to said second weighting device;
   a third XOR gate having a first input connected to said output of said second flip-flop and to said first input of said third flip-flop, a second input connected to said output of said third flip-flop and an output connected to said third weighting device;
   a fourth flip-flop having a first input connected to said data line, a second input connected to said second clock line and an output;
   a fifth flip-flop having a first input connected to said output of said fourth flip-flop, a second input connected to said first clock line and an output;
   a sixth flip-flop having a first input connected to said output of said fifth flip-flop and a second input connected to said second clock line; and correction devices for producing a correction signal;
   the first and second clock signals having clock rates corresponding to substantially half the high clock rate, and the first clock signals having a phase shifted by 180° with respect to a phase of the second clock signals.

2. The phase detector according to claim 1, wherein said correction devices include:
   a further XOR gate having a first input connected to said output of said first flip-flop and a second input connected to said output of said fourth flip-flop;
   a first AND gate having a first input connected to an output of said further XOR gate, a second input connected to said first clock line and a further input connected to said output of said second flip-flop;
   a second AND gate having a first input connected to said output of said further XOR gate and a second input connected to said first clock line; and
   a fourth, a fifth and a sixth weighting device, said fourth weighting device having a first input of connected to said first clock line, said fifth weighting device having a first input connected to an output of said first AND gate, and said sixth weighting device having a first input connected to an output of said second AND gate;
   the correction signal being produced from the output signals of said fourth, fifth and sixth weighting devices.

3. A clock regeneration device, comprising:
   a data line transmitting at least at a high clock rate;
   a first clock line for transmitting first clock signals and a second clock line for transmitting second clock signals;
   a phase detector, an oscillator, and an integrator connected to said phase detector and connected to said oscillator, said oscillator producing the first and second clock signals, said phase detector including:
   a first weighting device, a second weighting device and a third weighting device;
   a first flip-flop having a first input connected to said data line, a second input connected to said first clock line and an output;
   a second flip-flop having a first input connected to said output of said first flip-flop, a second input connected to said second clock line and an output;
   a third flip-flop having a first input connected to said output of said second flip-flop, a second input connected to said first clock line and an output;

a first XOR gate having a first input connected to said data line, a second input connected to said output of said first flip-flop and an output connected to said first weighting device;

a second XOR gate having a first input connected to said output of said first flip-flop and to said first input of said second flip-flop, a second input connected to said output of said second flip-flop and to said first input of said third flip-flop and an output connected to said second weighting device;

a third XOR gate having a first input connected to said output of said second flip-flop and to said first input of said third flip-flop, a second input connected to said output of said third flip-flop and an output connected to said third weighting device;

a fourth flip-flop having a first input connected to said data line, a second input connected to said second clock line and an output;

a fifth flip-flop having a first input connected to said output of said fourth flip-flop, a second input connected to said first clock line and an output;

a sixth flip-flop having a first input connected to said output of said fifth flip-flop and a second input connected to said second clock line; and correction devices for producing a correction signal;

the first and second clock signals having clock rates corresponding to substantially half the high clock rate, and the first clock signals having a phase shifted by 180° with respect to a phase of the second clock signals.

4. The clock regeneration device according to claim 3, wherein said phase detector feeds the correction signal to said integrator.

5. The clock regeneration device according to claim 3, wherein a control signal for said oscillator is produced from the correction signal and from the respective output signals from said first, second and third weighting devices.

6. The clock regeneration device according to claim 3, wherein said correction devices include:

a further XOR gate having a first input connected to said output of said first flip-flop and a second input connected to said output of said fourth flip-flop;

a first AND gate having a first input connected to an output of said further XOR gate, a second input connected to said first clock line and a further input connected to said output of said second flip-flop;

a second AND gate having a first input connected to said output of said further XOR gate and a second input connected to said first clock line; and a fourth, a fifth and a sixth weighting device, said fourth weighting device having a first input connected to said first clock line, said fifth weighting device having a first input connected to an output of said first AND gate, and said sixth weighting device having a first input connected to an output of said second AND gate;

the correction signal being produced from output signals of said fourth, fifth and sixth weighting devices.

7. The clock regeneration device according to claim 3, including a frequency detector for frequency centering, said frequency detector connected to said first and second clock lines and said integrator such that said frequency detector can transmit a frequency detector signal to said integrator, said integrator including switching devices for producing a control signal from the frequency detector signal, the correction signal and output signals of said first, second and third weighting devices.

8. The clock regeneration device according to claim 6, including a frequency detector for frequency centering, said frequency detector connected to said first and second clock lines and said integrator such that said frequency detector can transmit a frequency detector signal to said integrator, said integrator including switching devices for producing a control signal from the frequency detector signal, the correction signal and output signals of said first, second and third weighting devices.

\* \* \* \* \*